United States Patent
Jung

(10) Patent No.: US 7,601,580 B2
(45) Date of Patent: Oct. 13, 2009

(54) IMAGE SENSOR AND METHOD OF FABRICATING THE SAME

(75) Inventor: Jong-Wan Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 140 days.

(21) Appl. No.: 11/706,370

(22) Filed: Feb. 15, 2007

(65) Prior Publication Data
US 2007/0190679 A1    Aug. 16, 2007

(30) Foreign Application Priority Data
Feb. 15, 2006    (KR)    ................ 10-2006-0014741

(51) Int. Cl.
*H01L 21/8238*    (2006.01)
(52) U.S. Cl. .................. 438/200; 257/E27.132
(58) Field of Classification Search .............. 257/291, 257/292, E27.132; 438/57, 69, 48, 199, 200
See application file for complete search history.

(56) References Cited
U.S. PATENT DOCUMENTS
7,038,259 B2 *    5/2006    Rhodes .................. 257/258

2006/0057760 A1 *    3/2006    Yi et al. .................. 438/57

FOREIGN PATENT DOCUMENTS

| JP | 2002-353331 | 12/2002 |
| KR | 1999-005824 | 1/1999 |
| KR | 1999-0070753 | 9/1999 |
| KR | 10-2000-0024718 | 5/2000 |

* cited by examiner

*Primary Examiner*—David Vu
(74) *Attorney, Agent, or Firm*—Harness, Dickey & Pierce, P.L.C.

(57) ABSTRACT

An image sensor may include a semiconductor substrate having a pixel array region and a logic region. A first gate electrode may be formed on the pixel array region of the semiconductor substrate. A lower electrode may be formed on a portion of the logic region of the semiconductor substrate. A first capping layer may be formed on at least a portion of the lower electrode. A dielectric layer may be formed on the first capping layer. An upper electrode may be formed on the dielectric layer. The first gate electrode and the lower electrode may include a polysilicon layer, and the first capping layer may include at least one of a metal layer and a metal silicide layer.

11 Claims, 4 Drawing Sheets

IMAGE SENSOR AND METHOD OF FABRICATING THE SAME

PRIORITY STATEMENT

This U.S. non-provisional application claims the benefit of priority of Korean Patent Application No. 10-2006-0014741, filed on Feb. 15, 2006, in the Korean Intellectual Property Office (KIPO), the disclosure of which is incorporated herein in its entirety by reference.

BACKGROUND

1. Field

Example embodiments relate to a semiconductor device and a method of fabricating the same, for example, an image sensor and a method of fabricating the same.

2. Description of the Related Art

Image sensors are semiconductor devices that convert optical images into electrical signals. Referring to FIG. 1, a CMOS image sensor may include a pixel array region that may receive and transfer optical signals, and a logic region that may control or process the optical signals to form an image.

The pixel array region may include unit pixels disposed as an array, and respective unit pixels may include photodiodes for receiving the optical signals and transfer units. The logic region may include a capacitor block for storing analog signals, an Analog-Digital Converter (ADC) block for converting the analog signals into digital signals, a decoder/driver block for selecting a unit pixel, and/or a control register block.

Conventional image sensors may use polysilicon film in a transistor or a capacitor to decrease a noise or a dark defect occurring in the pixel array region. For example, a CMOS image sensor may include a capacitor having electrodes and gate electrodes composed of polysilicon film.

However, despite being doped at a high density, polysilicon film may involve depletion between dissimilar metals. A depletion region may be formed at an interfacial surface between electrodes and a dielectric layer of a capacitor, and may change the capacitance of the capacitor. For example, if depletion occurs, a voltage coefficient of the capacitor may be changed. In turn, if the voltage coefficient of the capacitor is changed, an analog signal may be changed. As a result, resolution of a digital signal from the ACD output unit may be degraded.

Instead of decreasing the noise or the dark defect, the transistors of the logic region may be operated at a higher speed. However, a gate electrode composed of polysilicon film may be unsuitable for a higher operating speed.

Separate fabrication of the logic region and the pixel array region may complicate the fabrication process, and may increase cost.

SUMMARY

Example embodiments may provide an image sensor that may reduce noise and dark defects in a pixel array region, and may reduce or prevent depletion of a capacitor in a logic region and/or increase a speed of a transistor in the logic region.

Example embodiments may provide a method of fabricating the image sensor to simultaneously form a gate electrode of the pixel array region and a lower electrode and/or a gate electrode of the logic region.

In an example embodiment, an image sensor may include a semiconductor substrate having a pixel array region and a logic region. A first gate electrode may be formed on the pixel array region of the semiconductor substrate. A lower electrode may be formed on the logic region of the semiconductor substrate. A first capping layer may be formed on at least a portion of the lower electrode. A dielectric layer may be formed on the first capping layer. An upper electrode may be formed on the dielectric layer. The first gate electrode and the lower electrode may include a polysilicon layer and the first capping layer may include at least one of a metal layer and a metal silicide layer.

According to an example embodiment, a second gate electrode may be formed on the logic region of the semiconductor substrate. The second gate electrode may include a polysilicon layer.

According to an example embodiment, a second capping layer may be formed on the second gate electrode. The second capping layer may include a metal silicide layer.

According to an example embodiment, a source region and a drain region may be formed in the semiconductor substrate on opposite sides of the second gate electrode. Third capping layers may be formed on the source region and the drain region. The third capping layers may include a metal silicide layer.

According to an example embodiment, the metal silicide layers of the second capping layer and the third capping layers may include tungsten silicide, titanium silicide, cobalt silicide or nickel silicide.

According to an example embodiment, an insulating layer may be interposed between the second gate electrode and the semiconductor substrate.

According to an example embodiment, the metal silicide layer of the first capping layer may include tungsten silicide, titanium silicide, cobalt silicide or nickel silicide.

According to an example embodiment, the upper electrode may include at least one of a polysilicon layer and a metal layer.

According to an example embodiment, an insulating layer may be interposed between the first gate electrode and the semiconductor substrate and between the lower electrode and the semiconductor substrate.

In an example embodiment, a method of fabricating an image sensor may include forming a polysilicon layer on a semiconductor substrate having a pixel array region and a logic region. A first capping layer may be formed on the polysilicon layer, and the first capping layer may include at least one of a metal layer and a metal silicide layer. A dielectric layer may be formed on the first capping layer. An upper electrode layer may be formed on the dielectric layer. The upper electrode layer, the dielectric film and the first capping film may be patterned to form an upper electrode, a dielectric film and a first capping film stacked on a portion of the polysilicon layer within the logic region of the semiconductor substrate. The polysilicon layer may be patterned to form a first gate electrode in the pixel array region of the semiconductor substrate and a lower electrode interposed between the first capping film and a portion of the logic region of the semiconductor substrate.

According to an example embodiment, the polysilicon layer may be patterned to form a second gate electrode on the logic region of the semiconductor substrate.

According to an example embodiment, a second capping layer may be formed on the second gate electrode. The second capping layer may include a metal silicide layer.

According to an example embodiment, a source region and a drain region may be formed in the semiconductor substrate of opposite sides of the second gate electrode. Third capping layers may be formed on the source region and the drain region. The third capping layers may include a metal silicide layer.

According to an example embodiment, the metal silicide layer of the second capping layer and the third capping layers may be formed by self-alignment, using thermal treatment.

According to an example embodiment, the metal silicide layers of the second capping layer and the third capping layers may include tungsten silicide, titanium silicide, cobalt silicide or nickel silicide.

According to an example embodiment, the metal silicide layer of the first capping layer may include tungsten silicide, titanium silicide, cobalt silicide or nickel silicide.

According to an example embodiment, the upper electrode may include at least one of a polysilicon layer and a metal layer.

According to an example embodiment, an insulating layer may be interposed between the polysilicon layer and the semiconductor substrate.

According to an example embodiment, forming the upper electrode, the dielectric film, and the first capping film in a stack may include forming an etch blocking layer that covers a portion of the upper electrode; sequentially etching the upper electrode layer, the dielectric layer, and the first capping layer exposed by the etch blocking layer; and removing the etch blocking layer.

BRIEF DESCRIPTION OF THE DRAWINGS

Example embodiments will be described with reference to the accompanying drawings.

DESCRIPTION OF EXAMPLE EMBODIMENTS

Figure 1:
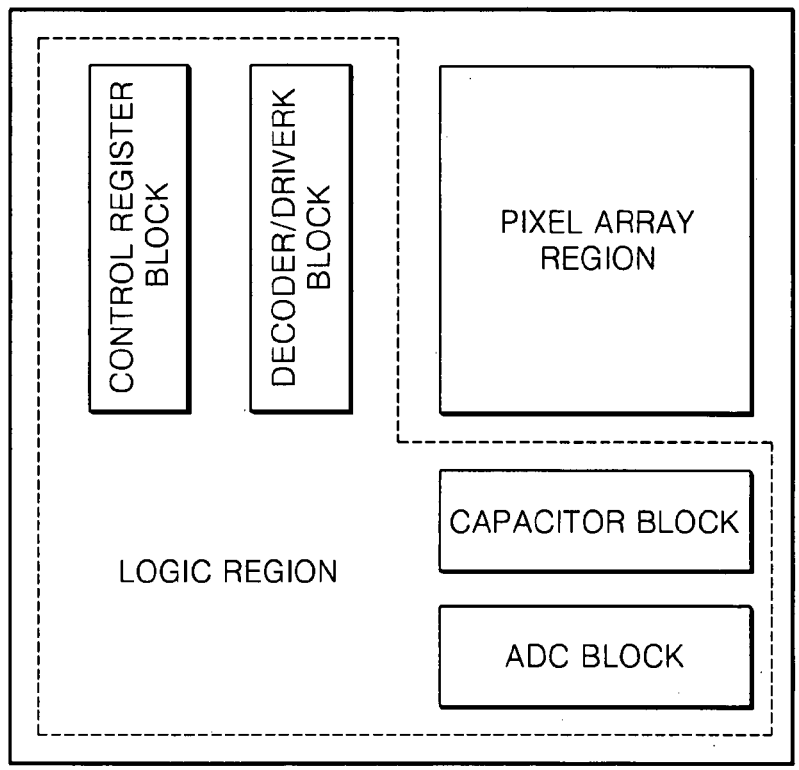
FIG. 1 is a block diagram of a conventional image sensor.

Example embodiments will now be described more fully with reference to the accompanying drawings. Example embodiments may, however, be embodied in many different forms and should not be construed as being limited to the example embodiments set forth herein; rather, these example embodiments are provided so that this disclosure will be thorough, and will fully convey the scope to those skilled in the art.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). The thicknesses of layers and regions are exaggerated for clarity. Variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
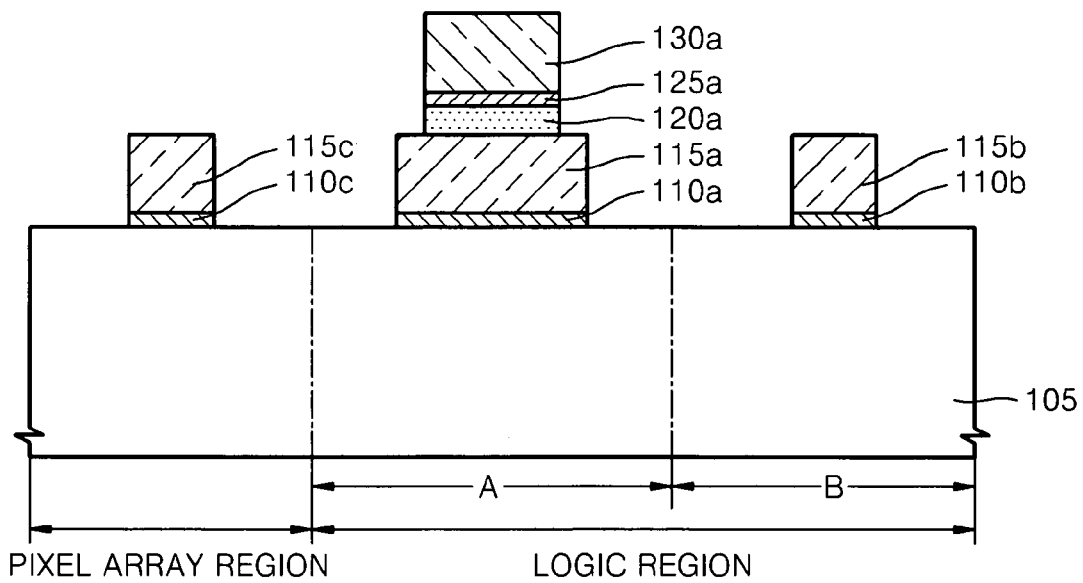
FIG. 2 is a cross-sectional of an image sensor according to an example embodiment.

FIG. 2 is a cross-sectional of an image sensor according to an example embodiment.

Referring to FIG. 2, a semiconductor substrate 105 may include a pixel array region and a logic region. The pixel array region may include unit pixels (not shown) arranged as an array. The unit pixels may include a photodiode (not shown) to receive an optical signal and a transfer unit (not shown).

The unit pixels may have a structure well known to those skilled in the art, which thus will not be described in detail.

The logic region may include logic devices (not shown) for controlling or processing optical signals to form an image. For example, FIG. 1 illustrates a planar arrangement of a pixel array region and a logic region. The logic region may include a capacitor block, an ADC block, a decoder/driver block, and/or a control register block. However, the blocks enumerated here are just illustrative, and it would be obvious to one skilled in the art that the logic region may include other blocks.

For example, block A may denote the capacitor block, and block B may denote the ADC block. However, for example, block B may denote the decoder/driver block or the control register block. Furthermore, blocks A and B may not be clearly classified. For example, the ADC block may include the capacitor block.

Hereinafter, the units formed in the pixel array region and the logic region will be described in more detail. A first gate electrode 115c may be a transistor that may constitute the transfer unit. The first gate electrode 115c may be formed on the pixel array region, and may be insulated from the semiconductor substrate 105 by a first gate insulating layer 110c on the semiconductor substrate 105. For example, the first gate electrode 115c may include a polysilicon layer. For example, the polysilicon layer may be doped with n-type or p-type impurities.

The first gate electrode 115c formed in the pixel array region may not include a metal silicide layer nor a metal layer. Accordingly, the structure of the first gate electrode 115c may be suitable for reducing or preventing a noise and/or a dark defect.

A capacitor may be formed on block A of the logic region. The capacitor may include a lower electrode 115a, a capping layer 120a, a dielectric layer 125a and/or an upper electrode 130a. An interlayer insulating layer 110a may be interposed between the lower electrode 115a and block A of the semiconductor substrate 105. The capping layer 120a may be formed on a portion of an upper surface of the lower electrode 115a. Alternatively, the capping layer 120 may be formed to cover the entire upper surface of the lower electrode 115a. The dielectric layer 125a may be formed on the capping layer 120a, and the upper electrode 130a may be formed on the dielectric layer 125a.

For example, the lower electrode 115a may include a polysilicon layer. For example, the polysilicon layer may be doped with n-type or p-type impurities. The lower electrode 115a may be composed of the same material as that of the first gate electrode 115c of the pixel array region.

The capping layer 120a may include a metal layer or a metal silicide layer. For example, the capping layer 120a may have an electrical resistivity lower than that of the lower electrode 115a. However, the lower electrode 115a and the capping layer 120a may not necessarily be distinguished as separate parts because of having different electrical conductivity, and it would be obvious to one skilled in the art that the capping layer 120a may be formed as a portion of the lower electrode 115a.

For example, the metal layer of the capping layer 120a may include tungsten, titanium or titanium nitride. For example, the metal silicide of the capping layer 120a may include tungsten silicide, titanium silicide, cobalt silicide or nickel silicide. For example, the dielectric layer 125a may include silicon oxide, silicon nitride or a high-k (high dielectric constant) insulator. An upper electrode 130a may include a metal layer or a polysilicon layer.

According to the capacitor structure on block A, the depletion that may conventionally cause a problem may not occur in the lower electrode 115a, despite the lower electrode 115a having a polysilicon layer. For example, a voltage coefficient of the capacitor may be improved relative to a conventional capacitor. The voltage coefficient of the capacitor may be improved because the capping layer 120a may contact the dielectric layer 125a, and the capping layer 120a including the metal or the metal silicide may not undergo depletion.

Furthermore, if the upper electrode 130a includes a metal layer, the upper electrode 130a may not undergo depletion. However, if the upper electrode 130a includes a polysilicon layer, the influence of the depletion may be decreased. For example, the depletion may be decreased by about half of that of a conventional upper electrode. The decrease of the depletion (e.g., the improvement of the voltage coefficient) may decrease a variation in the analog signal of the capacitor, thus the resolution of a digital signal provided from the ADC may be improved.

A second gate electrode 115b may be formed on block B of the logic region. The second gate electrode 115b may be a transistor that may constitute the logic device. A second gate insulating layer 110b may be interposed between the second gate electrode 115b and the semiconductor substrate 105. For example, the second gate electrode 115b may include a polysilicon layer. For example, the polysilicon layer may be doped with n-type or p-type impurities.

According to an example embodiment described as above, the noise and/or the dark defect generated in the pixel array region may be reduced or prevented, and the voltage coefficient in the capacitor structure of the logic region may be improved. If the voltage coefficient is improved, the resolution of the output digital signal may be improved, thus the resolution of the image may be improved.

Figure 3:
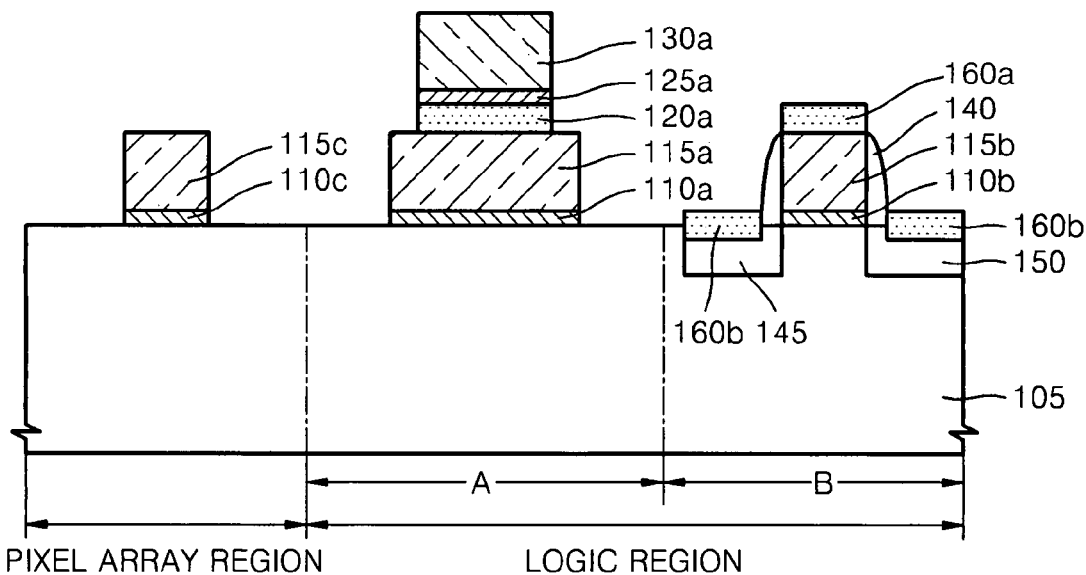
FIG. 3 is a cross-sectional of an image sensor according to an example embodiment.

FIG. 3 is a cross-sectional of an image sensor according to an example embodiment. The example embodiment of the image sensor is a modification of the foregoing image sensor according to the above-described example embodiment of FIG. 2. The example embodiments of FIGS. 2 and 3 differ only in the block B portion of the logic region. Therefore, only the differences from the above example embodiments will be described, and thus repeated portions will not be described.

Referring to FIG. 3, a second gate electrode 115b may be formed on block B of the logic region. The second gate electrode 115b may be a transistor that may constitute the logic device. A second gate insulating layer 110b may be interposed between the second gate electrode 115b and the semiconductor substrate 105. A second capping layer 160a may be formed on the second gate electrode 115b. A source region 145 and a drain region 150 may be respectively formed in the semiconductor substrate 105 on opposite sides of the second gate electrode 115b. The second capping layer 160a may be formed on the second gate electrode 115b, and third capping layers 160b may be formed on/in the source region 145 and the drain region 150.

For example, the second capping layer 160a and the third capping layers 160b may include a metal silicide layer. For example, the metal silicide layer of the second capping layer 160a and the third capping layers 160b may include a tungsten silicide layer, a titanium silicide layer, a cobalt silicide layer, or a nickel silicide layer. For example, the second capping layer 160a and the third capping layers 160b may have a metal silicide of the same material with a self-aligned structure (e.g., metal silicide structure). The second capping layer 160a and the third capping layers 160b may lower a parasitic resistance of the logic device, which in turn may increase a speed of the logic device.

According to an example embodiment, the noise and/or the dark defect generated in the pixel array region may be reduced or prevented. The voltage coefficient may be improved in the capacitor structure of the logic region, and the speed of the logic units of the logic region may be improved.

In an example embodiment, the second capping layer 160a on the second gate electrode 115b, and the third capping layers 160b on the source region 145 and the drain region 150 may be selectively omitted.

FIGS. 4 through 8 are cross-sectional views of a method of fabricating the image sensor according to an example embodiment.

Figure 4:
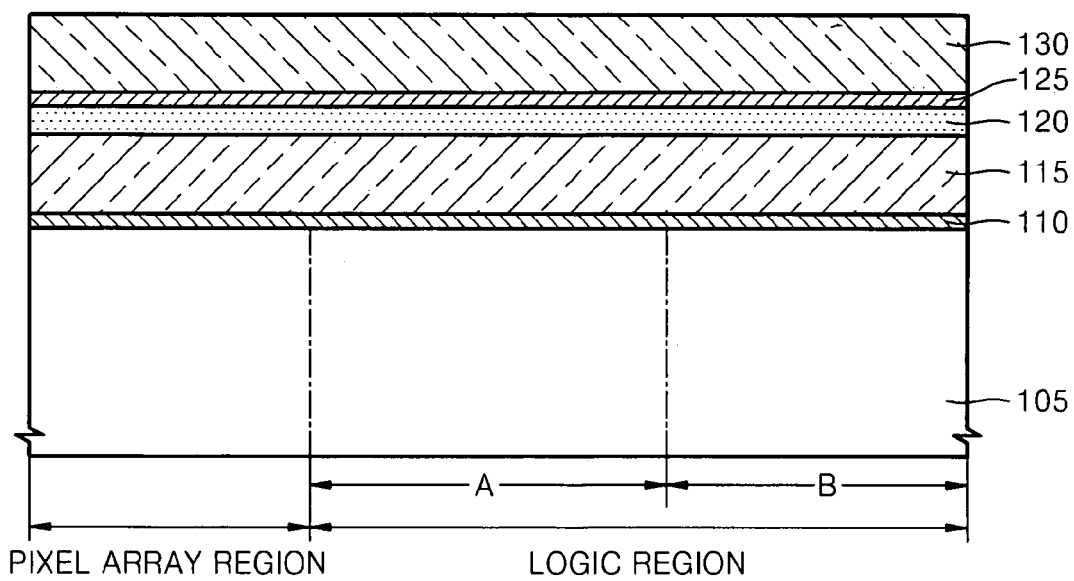
FIGS. 4 through 8 are cross-sectional views of a method of fabricating the image sensor according to an example embodiment.

Referring to FIG. 4, an insulating layer 110 and a polysilicon layer 115 may be formed on a semiconductor substrate 105 where a pixel array region and a logic region may be defined. For example, the insulating layer 110 may be formed using Chemical Vapor Deposition (CVD) or thermal oxidation. For example, the polysilicon layer 115 may be formed using CVD.

A first capping layer 120 may be formed on the polysilicon layer 115. The first capping layer 120 may include a metal layer or a metal silicide layer. For example, the first capping layer 120 may be formed using CVD or Physical Vapor Deposition (PVD).

A dielectric layer 125 may be formed on the first capping layer 120, and an upper electrode layer 130 may be formed on the dielectric layer 125. For example, the dielectric layer 125 may include a silicon oxide layer, a silicon nitride layer or a high-k insulating layer, and may be formed by CVD or PVD. The upper electrode 130 may include a metal layer or a metal silicide layer.

For example, the metal layer of the first capping layer 120 and the upper electrode 130 may include tungsten, titanium or titanium nitride. For example, the metal silicide layer may include tungsten silicide, titanium silicide, cobalt silicide or nickel silicide.

Figure 5:
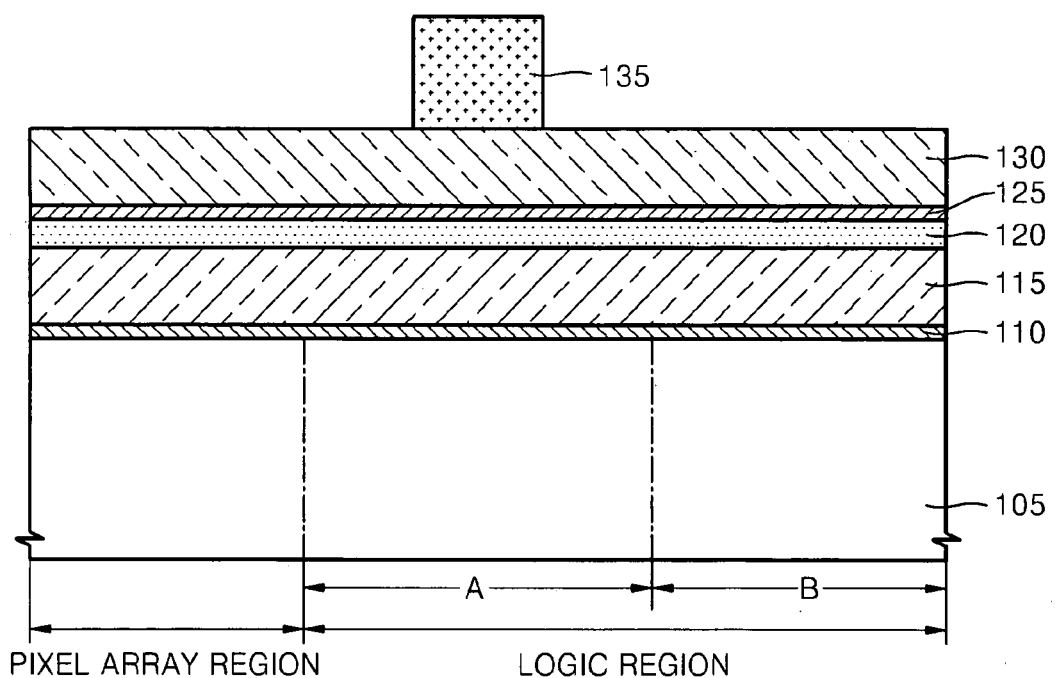

Referring to FIG. 5, an etch blocking layer 135 may be formed to cover a predetermined or desired portion of the upper electrode layer 130 on block A of the logic region. For example, the etch blocking layer 135 may include a photoresist layer. For example, the photoresist layer may be formed using photolithography.

Figure 6:
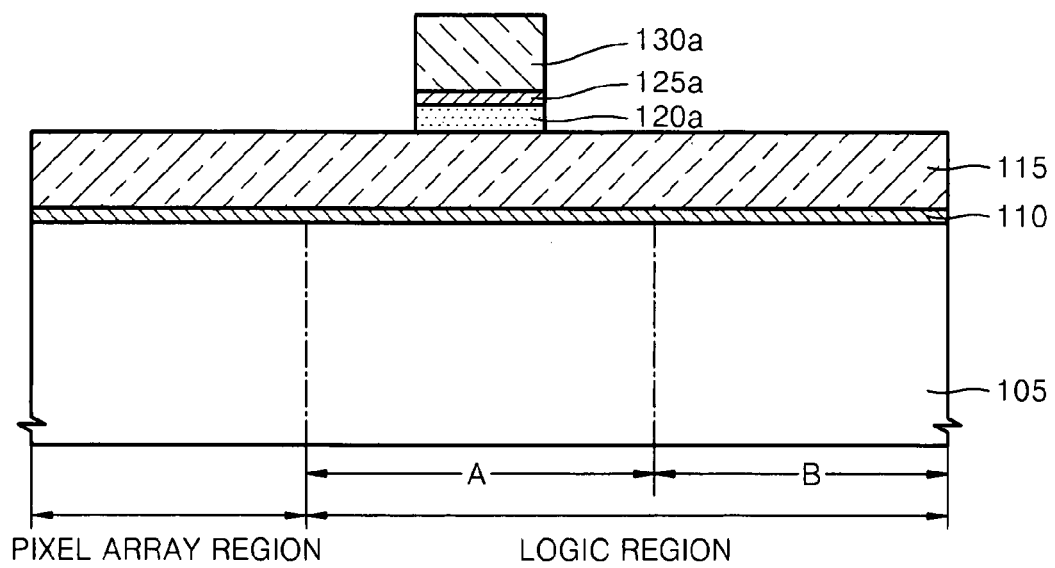

Referring to FIG. 6, the upper electrode layer 130, the dielectric layer 125, and the first capping layer 120 exposed by the etch blocking layer 135 may be sequentially etched, and the etch blocking layer 135 may be removed. By doing so, the first capping layer 120a, the dielectric layer 125a and the upper electrode 130a stacked on the polysilicon layer 115 may be formed on block A of the logic region.

Figure 7:
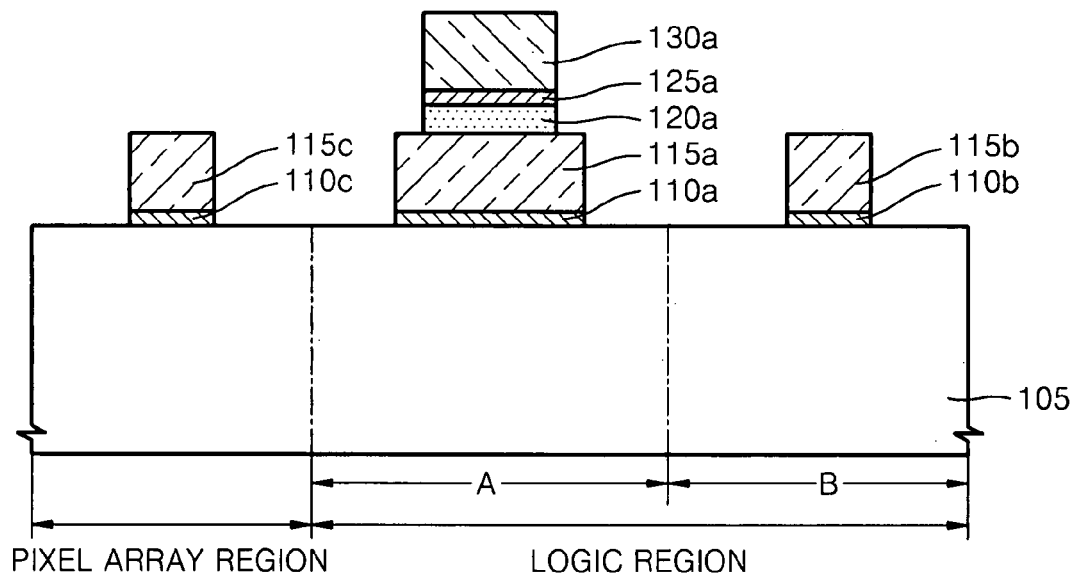

Referring to FIG. 7, the polysilicon layer 115 may be patterned, so that a first gate electrode 115c on the pixel array region, a lower electrode 115a interposed between block A of the logic region and the first capping layer 120a, and/or a second gate electrode 115b on block B of the logic region may be formed. For example, patterning of the polysilicon layer 115 may be performed using photolithography and etching. The first gate electrode 115c, the lower electrode 115a, and/or the second gate electrode 115b may be formed simultaneously.

The insulating layer 110 may be patterned to form the first gate insulating layer 110c between the first gate electrode 115c and the pixel array region, the interlayer insulating layer 110a between the lower electrode 115a and block A, and the second gate insulating layer 110b between the second gate electrode 115b and block B. The first gate insulating layer 110c, the interlayer insulating layer 110a, and/or the second gate insulating layer 110b may be formed simultaneously.

Figure 8:
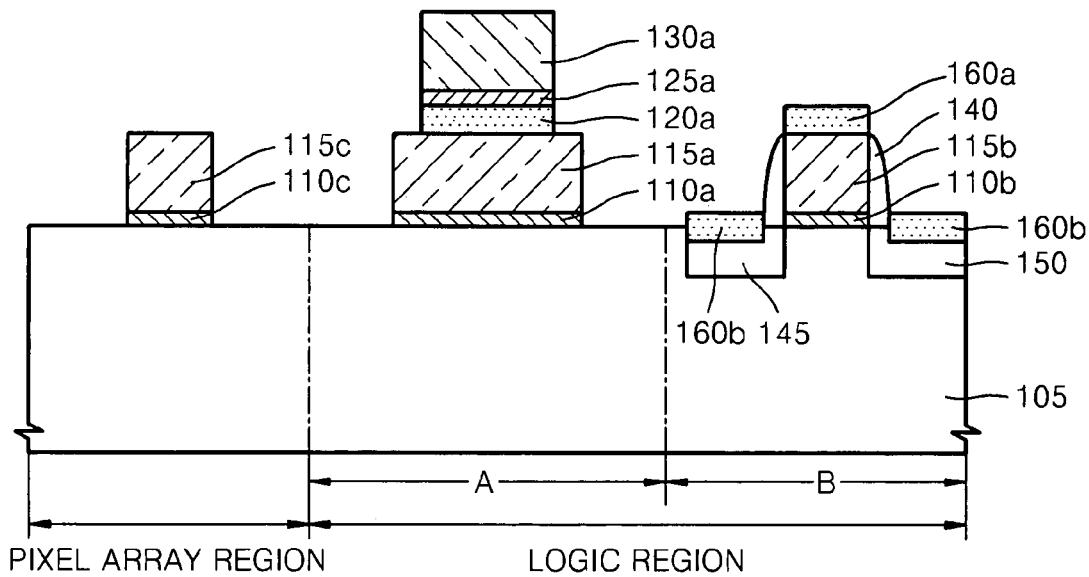

Referring to FIG. 8, a source region 145 and a drain region 150 may be formed in the semiconductor substrate 105 on both sides of the second gate electrode 115b. For example, the source region 145 and the drain region 150 may be formed by selectively doping impurities and thermal treatment.

A spacer insulating layer 140 may be formed along sidewalls of the second gate electrode 115b. A spacer insulating layer 140 may also be formed along the sidewalls of the first gate electrode 115c, the upper electrode 130a and the lower electrode 115a.

A second capping layer 160a may be formed on the second gate electrode 115b on block B of the logic region. Third capping layers 160b may be formed on the source region 145 and the drain region 150. The second capping layer 160a and the third capping layers 160b may include metal silicide. For example, the second capping layer 160a and the third capping layers 160b may be simultaneously formed by a self-alignment structure, using thermal treatment. For example, the second capping layer 160a and the third capping layers 160b may be formed as metal silicide structures.

For example, the metal silicide structures may be formed by depositing a metal layer, performing first thermal treatment, wet etching, and performing second thermal treatment. A blocking insulating layer (not shown) may be formed on the pixel array region and the logic region before depositing the metal layer so as not to form metal silicide on the pixel array region and block A of the logic region.

According to an example embodiment of a method of fabricating an image sensor, the second capping layer 160a and the third capping layers 160b may not be formed. According to an example embodiment of a method of fabricating an image sensor, the second capping layer 160a may be formed, but the third capping layers may not be formed. For example, the second capping layer 160a may not be formed by the self-alignment structure.

According to an example embodiment of a method of fabricating an image sensor, the first gate electrode 115c of the transistor of the pixel array region, the lower electrode 115a of the capacitor of the logic region, and the second gate electrode 115b of the logic region may be simultaneously formed. Consequently, the process may be simplified, and fabricating cost may be reduced.

While example embodiments have been particularly shown and described, it will be understood by those of ordinary skill in the art that various changes in form and details may be made therein without departing from the spirit and scope of the example embodiments as defined by the following claims.

What is claimed is:

1. A method of fabricating an image sensor comprising:
   forming a polysilicon layer on a semiconductor substrate having a pixel array region and a logic region;
   forming a first capping layer on the polysilicon layer, the first capping layer including at least one of a metal layer and a metal silicide layer;
   forming a dielectric layer on the first capping layer;
   forming an upper electrode layer on the dielectric layer;
   patterning the upper electrode layer, the dielectric layer and the first capping layer to form an upper electrode, a dielectric film and a first capping film stacked on a first portion of the polysilicon layer within the logic region of the semiconductor substrate and to expose a second portion of the polysilicon layer within the pixel array region and the logic region of the semiconductor substrate; and
   patterning the second portion of the polysilicon layer to form a first gate electrode in the pixel array region of the semiconductor substrate and a lower electrode interposed between the first capping film and the logic region of the semiconductor substrate.

2. The method of claim 1, further comprising patterning the polysilicon layer to form a second gate electrode on the logic region of the semiconductor substrate.

3. The method of claim 2, wherein the first gate electrode, the lower electrode, and the second gate electrode are formed simultaneously.

4. The method of claim 2, further comprising forming a second capping layer on the second gate electrode, the second capping layer including a metal silicide layer.

5. The method of claim 4, further comprising:
forming a source region and a drain region in the semiconductor substrate on opposite sides of the second gate electrode; and
forming third capping layers on the source region and the drain region, the third capping layers including metal silicide.

6. The method of claim 5, wherein the metal silicide layers of the second capping layer and the third capping layers are formed by self-alignment, using thermal treatment.

7. The method of claim 5, wherein the metal silicide layers of the second capping layer and the third capping layers include tungsten silicide, titanium silicide, cobalt silicide or nickel silicide.

8. The method of claim 1, wherein the metal silicide layer of the first capping layer includes tungsten silicide, titanium silicide, cobalt silicide or nickel silicide.

9. The method of claim 1, wherein the upper electrode includes at least one of a polysilicon layer and a metal layer.

10. The method of claim 1, further comprising forming an insulating layer interposed between the polysilicon layer and the semiconductor substrate.

11. The method of claim 1, wherein forming the upper electrode, the dielectric film, and the first capping film in a stack includes:
forming an etch blocking layer that covers a portion of the upper electrode layer;
sequentially etching the upper electrode layer, the dielectric layer and the first capping layer exposed by the etch blocking layer; and
removing the etch blocking layer.

* * * * *